(12) United States Patent
Farshchian (10) Patent No.: US 11,156,647 B1
(45) Date of Patent: Oct. 26, 2021

(54) METHOD TO ESTIMATE THE RISE-TIME OF A PULSE FOR SINGLE AND MULTI-CHANNEL DATA

(71) Applicant: BAE SYSTEMS Information and Electronic Systems Integration Inc., Nashua, NH (US)

(72) Inventor: Masoud Farshchian, Englewood Cliffs, NJ (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/894,285

(22) Filed: Jun. 5, 2020

(51) Int. Cl.
*G01R 29/027* (2006.01)

(52) U.S. Cl.
CPC ................ *G01R 29/0276* (2013.01)

(58) Field of Classification Search
CPC .................................... G01R 29/0276
See application file for complete search history.

(56) References Cited

U.S. PATENT DOCUMENTS

| 6,911,859 B2 * | 6/2005 | Komiak | H03D 5/00 327/350 |
|---|---|---|---|
| 2011/0085612 A1 | 4/2011 | Muraoka et al. | |
| 2013/0336425 A1 | 12/2013 | Lee et al. | |
| 2017/0094527 A1 | 3/2017 | Shattil et al. | |
| 2018/0123633 A1 | 5/2018 | Graveley et al. | |
| 2018/0145824 A1 | 5/2018 | Carroll | |
| 2020/0184997 A1 | 6/2020 | Lawson et al. | |

OTHER PUBLICATIONS

Tektronix, "Fundamentals of Radar Measurements", no date, www.tektronix.com/radar, pp. 1-52.*
Jan Matuszewski et al., Knowledge-based Signal Processing for Radar Identification, Feb. 2008, TCSET'2008, IEEE Xplore, pp. 302-305 (Year: 2008).*
Office Action for U.S. Appl. No. 16/865,639, dated Mar. 4, 2021, 16 Pages.
Ivan Selesnick (Total Variation Denoising (an MM algorithm)), Sep. 10, 2012. Last edit: Jan. 23, 2017: http://eeweb.poly.edu/iselesni/lecture_notes/TVDmm/.
Ivan Selesnick (Total Variation Denoising via the Moreau Envelope), IEEE Signal Processing Letters (preprint), p. 1-7, arXic;1701.00439v1 [math.OC] Jan. 2, 2017.
Chan, Tony F. & Osher, Stanley & Shen, Jianhong, "The Digital TV Filter and Nonlinear Denoising", IEEE Transactions on Image Processing, Feb. 2001, 11 Pages, vol. 10, No. 2, Rochester, NY, USA.
Bach, Francis & Jenatton, Rodolphe & Mairal, Julien & Obozinski, Guillaume, "Structured Sparsity Through Convex Optimization", INRIA, Apr. 20, 2012, 27 Pages, University of California, Berkeley.

(Continued)

*Primary Examiner* — Mischita L Henson
(74) *Attorney, Agent, or Firm* — Maine Cernota & Rardin; Scott J. Asmus (57) ABSTRACT

Techniques, systems, architectures, and methods for estimating the rise time of a pulse for multi-channel and signal channel cases involving an optimization system and method that can be solved iteratively based on sparse priors for a wide span of signal-to-noise ratios.

19 Claims, 5 Drawing Sheets

(56) References Cited

OTHER PUBLICATIONS

Selesnick, Ivan W. & Bayram, Ilker, "Sparse Signal Estimation by Maximally Sparse Convex Optimization", IEEE Transactions on Signal Processing, Mar. 1, 2014, 15 Pages, vol. 62, No. 5, London, UK.
Candes, Emmanuel J. & Wakin, Michael B., & Boyd, Stephen P., "Enhancing Sparsity by Reweighted Minimization", Birkhauser Boston, Oct. 15, 2008, 29 Pages, Cambridge, MA, USA.
Afonso, Manya V., "An Augmented Lagrangian Approach to the Constrained Optimization Formulation of Imaging Inverse Problems", IEEE Transactions on Image Processing, Mar. 2011, 15 Pages vol. 20, No. 3, Rochester, NY, USA.
Combettes, Patrick L. & Pesquet, Jean-Christophe, "Proximal Splitting Methods in Signal Processing", Fixed-Point Algorithms for Inverse Problems in Science and Engineering, May 9, 2011, 25 Pages, Springer Optimization and Its Applications, vol. 49.
Figueiredo, Mario A. T. & Bioucas-Dias, Jose M. & Nowak, Robert D., "Majorization-Minimization Algorithms for Wavelet-Based Image Restoration", IEEE Transactions on Image Processing, Dec. 2007, 12 Pages, vol. 16, No. 12, Rochester, NY, USA.
Pace, Phillip E. Detecting and classifying low probability of intercept radar. Artech House, 2009.
Gardner, William A. "An inkroduction to cyclostationary signals." Cyclostationarity in communications and signal processing (1994): 1-90.
Dr. Farshchian, Masoud and Alexander, William. "A method to estimate multi-periodic signals and detect their features in interference." 2019. 10 Pages.

\* cited by examiner

METHOD TO ESTIMATE THE RISE-TIME OF A PULSE FOR SINGLE AND MULTI-CHANNEL DATA

FIELD OF THE DISCLOSURE

The following disclosure relates generally to radar systems and, more specifically, to systems and method to estimate the rise-time of a pulse for single and multi-channel data.

BACKGROUND

Accurate estimation of the rise-time of a pulse when the received pulse characteristic is not known can be useful in different applications. For example, current, state of the art radar systems have the capability to rapidly change their center frequency and modulation type. Consequently, systems and methods of associating the received pulses with different radar types is fundamentally important to identifying and geolocating them and could be used alongside traditional feature identifiers such as center frequency, Pulse Repetition Interval (PRI), pulse length, modulation type, etc. For example, for radar systems, where the rise-time of a pulse is impervious to frequency agility, PRI, and pulse-width, the rise-time of a pulse (also herein referred to simply as rise-time) can provide an independent feature, thereby increasing identification accuracy.

Current systems, however, do not use rise-time as part of the Pulse Descriptor Word (PDW), a description of the properties of a signal that may include amplitude, frequency, direction, etc. and that may be used to identify an unknown signal. This is primarily due to estimation errors in noise and interference.

What is needed, therefore, are systems and methods to accurately estimate the rise-time of a pulse for single and multi-channel data in both low and high signal-to-noise ratio (SNR) regimes while minimizing estimation errors due to noise and interference.

SUMMARY

An optimization system and method that can be solved iteratively based on sparse priors to estimate the rise-time of a pulse for a wide span of signal-to-noise ratios is herein disclosed. The method can be used as both a multi-channel and signal channel case, depending on accuracy vs computational complexity. Experimental results with a pulse of a rise-time of 50 nanoseconds are then provided.

Furthermore, while discussed primarily in the context of identification of unknown radar signatures, such techniques could also be used in wireless communications to differentiate different signals coming from different devices and in other applications where distinguishing between different signals is desired.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

BRIEF DESCRIPTION OF THE DRAWINGS

FIG. 2 is a plot describing ideal, noisy, and estimated signals with the characteristics described in Table 1 and FIG. 2;

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

A variety of acronyms are used herein to describe both the subject of the present disclosure and background therefore. A brief listing of such acronyms is provided below:
  ADMM—Alternating Direction Method of Multipliers;
  JGSDD—Joint Group-Sparse Denoising and Delay, a method of determining pulse rise-time based on iterative, convex optimization techniques;
  NC—Non-Convex;
  NC-GTVD—A more generalized form of TVD where the penalty function is non-separable and non-convex;
  PDW—Pulse Descriptor Word;
  PRI—Pulse Repetition Interval;
  Rise-time—The time it takes for a pulse to reach from 10% to 90% maximum height. It is estimated after the denoising algorithm presented in this patent; these reference levels can be changed to 20% to 80% or any arbitrary reference level of the rise-time of the pulse.
  RMS—Root-Mean Square;
  SNR—Signal to Noise Ratio;
  TDOA—Time Difference of Arrival; and
  TVD—Total Variation Denoising—A Signal Processing optimization technique that penalizes the variation of the signal in combination with its first derivative coefficients assumed to be sparse in order to estimate it.

The rise-time of the pulse can be used as an additional discriminator between different radar types. This is especially useful as the rise-time is independent of the center frequency of the pulse and thus frequency agility and other features that are used by some radars to confuse the EW receivers are not effective where such a discriminator is used.

More specifically, we disclose systems and methods involving the use of an algorithm to determine the rise time of a pulse where there are at least two noisy signals $y_1$ and $y_2$ measured across different antenna elements and it is assumed that that one channel is a delayed amplitude, scaled version of the other channel. We use the term $S^{-\alpha}$ to denote a delay operator where $S^{-\alpha}y_2 = \zeta y_2(n-\alpha)$ and assume that when there are no additive noise present, $y_1 = \zeta y_2(n-\alpha)$ for some (potentially complex) amplitude scaling factor and real value a. The variable a depends on the position of the target and measuring platform, the base-line, channel propagation conditions, sampling rate, waveform, frequency and other parameters related to the over-all measurement geometry. The variable n represents the sample time. In other words we assume the model, $y_1(n)=x(n)+v_1(n)$ and $y_2(n)=\zeta(S^{-\alpha}x(n))+v_2(n)$, where v represents noise and interference and x represents the original transmit signal.

We consider the optimization formulation and estimate x and a from the joint data:

$$F_\lambda\{y_1, y_2\} = \operatorname*{argmin}_{x,a,K} \left\{\frac{1}{2}w_1 \cdot \|y_1 - x\|_2^2 + \frac{1}{2}w_2 \cdot \|y_2 - x\|_2^2 + \lambda \cdot (\varphi(Dx; a, K))\right\} \quad \text{Equation (1)}$$

Here the penalty function (the regularization function), $\varphi$, can be chosen very arbitrarily, in embodiments depending on general characteristics of the data, such as the data being represented by a coefficients in a filter or transform domain. As an example, the derivative of an ideal pulse is primarily zero, except for the time-sample interval consisting of its fall-time and rise-time. Consequently, it makes sense to model a base-band pulse to be sparse (having mostly zero or near zero values) in the difference filter domain. Or, for example, if a signal is sparse in the Fourier domain, the regularization function can be suitably chosen to model sparsity in the frequency domain. Now regarding Equation 1, specifically, $w_1$, $w_2$, and $\lambda$ are weights for the data-fidelity terms and the regularization function, respectively. They may be chosen as scalars or higher dimensional vectors, when appropriate. As special cases, note in the above formulation, when one of $w_1$ or $w_2$ is set to zero, Equation (1) reduces to the single channel estimation case. Also, if the regularization parameter is set to zero, then least square estimation is performed. The variables a, and K relate to the parameters of the penalty function, as further described below, while is a complex scaling factor. Extension of the optimization above to multiple channel data would be within the skill of one of ordinary skill in the art.

Figure 2:
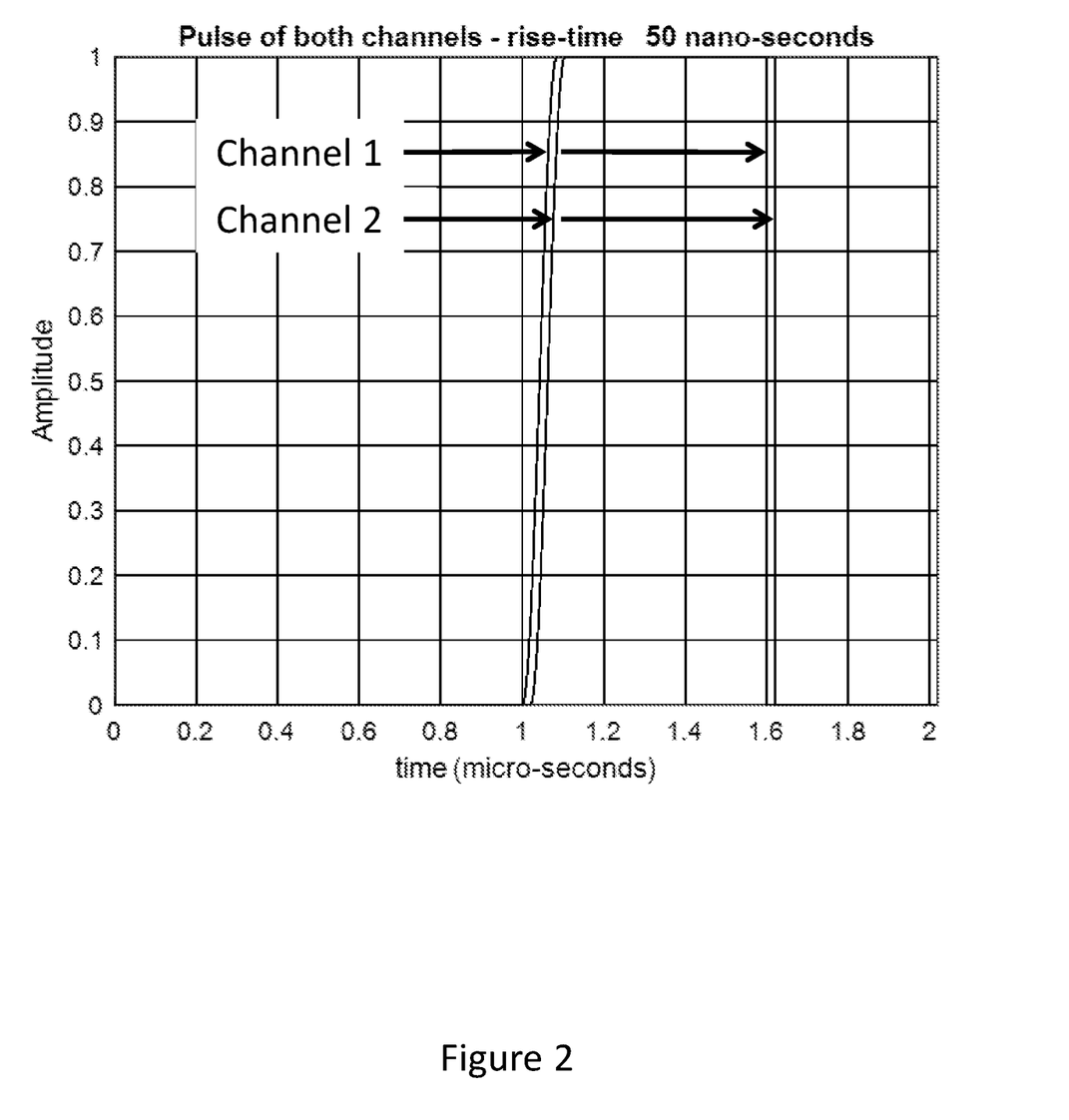
FIG. 2 is illustrates the pulse on two channels with a relative delay based on the parameters tabulated in Table 1.
Figure 3:
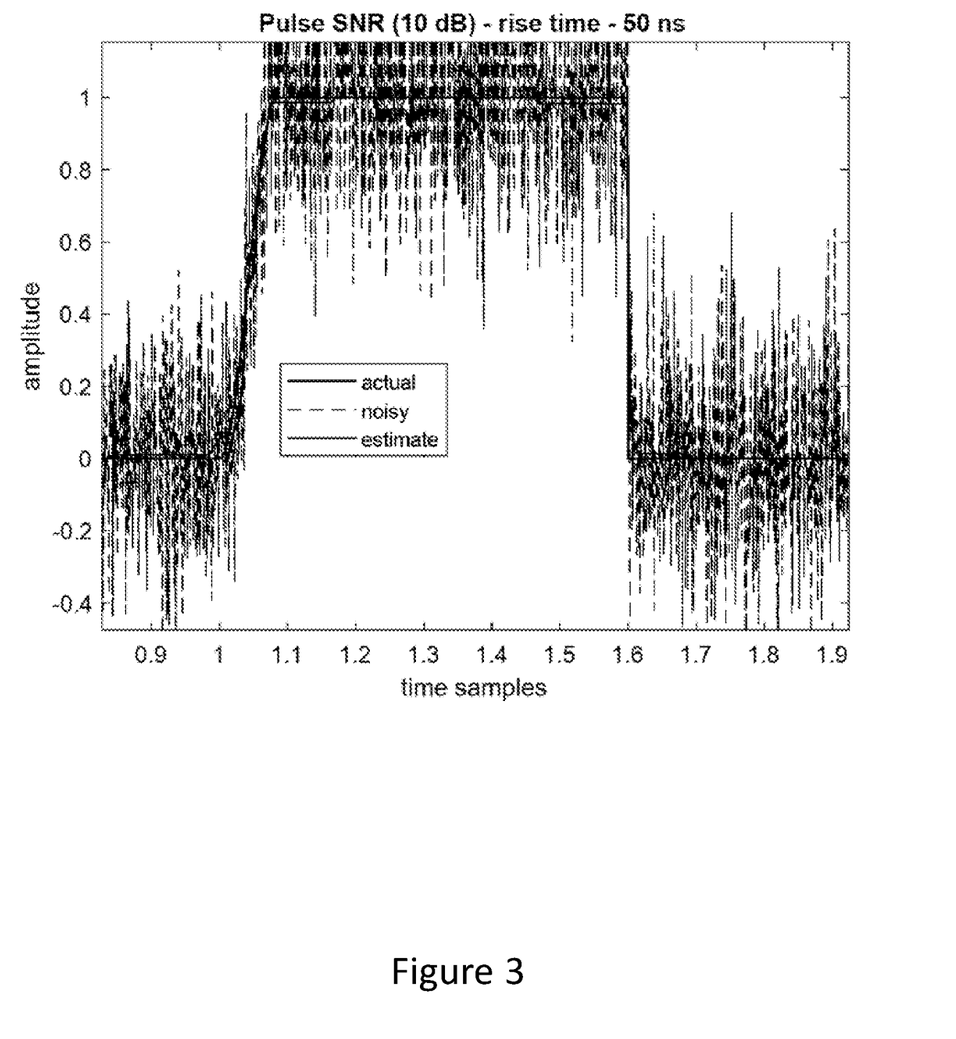
FIG. 3 is a plot showing a Monte Carlo simulation describing mean rise-time of the signal of FIG. 3 with the characteristics described in Table 1 and FIG. 2 over 200 Simulation points, as a function of Signal-to-Noise Ratio (SNR)

As a non-limiting example, we choose an appropriate penalty function to be such that it is assumed x represents data whose first order difference is sparse relative to its length with non-zero coefficients clustered together. This is a general assumption, since most pulse radars have an on and on period with a fall and rise-time. Embodiments also take into account combinations of sparsity in the first or/and higher order derivatives. For example, FIG. 2 shows a 50 nanosecond rise-time pulse (see Table 1 for parameters) for two different channels, and FIG. 3 shows the derivative of the pulse. As illustrated in FIG. 3, the pulse contains non-zero coefficients during the rise-time period and also when the power on transmission switch is turned off to the radar listening mode. FIG. 3 also illustrates that, during the rise-time, the first order difference of the pulse has multiple non-zero coefficients that are clustered together. We have chosen $\zeta=1$ for the current experiment. Although it is possible to normalize the power of both channels to solve Equation (1), in some situations, it is advantageous to have the variable as part of the total optimization framework. In addition, embodiments utilize penalty functions that are non-convex.

In embodiments, non-convex penalty function with parameters such that Equation (3) is still maintained as convex due to the combination of the data-fidelity terms and other convex regularizers are used to avoid local-minima. For example, the following non-convex penalty functions with over-lapping structure sparsity are used in embodiments, although many other cost functions would also be suitable, such as those described in the following texts, which are herein incorporated by reference, in their entirety:

a. Selesnick, Ivan W., and Ilker Bayram. "Sparse signal estimation by maximally sparse convex optimization." IEEE Transactions on Signal Processing 62.5 (2014): 1078-1092; and b. E. J. Candes, M. B. Wakin, and S. P. Boyd, "Enhancing sparsity by reweighted L1 minimization," J. Fourier Anal. Appl., vol. 14, no. 5-6, pp. 877-905, December 2008.

$$\varphi(x; a) = \sum_{i=1}^{N} \frac{2}{a\sqrt{3}}\left(\left(\arctan\frac{1 + 2af(x_i; K)}{\sqrt{3}}\right) - \frac{\pi}{6}\right) \quad \text{Equation (2)}$$

Where $f(x_i;K)$ is chosen to promote over-lapping structure sparsity and is defined as:

$$f(x_i; K) = \left[\sum_{k=0}^{K-1} |x(i+k)|^2\right]^{\frac{1}{2}} \quad \text{Equation (3)}$$

Here f represents a sliding Euclidean norm of size K that starts at sample i up to sample $K+i-1$ of the estimated sampled pulse x. The notation $x_i$ is used as a convention to note that the samples start at i for the estimated pulse x.

Here, f(x;K) can still be more generalized by using hamming (or other) types of weighting functions to weight the sum. Also, for K>1, we are assuming that the signal, x, has a cluster of close values. Lastly, the variable "a" promotes non-convexity allowing for more robust estimation of the signal in noise.

An alternative function is:

$$\varphi(x; a) = \sum_{i=1}^{N} \left[\sum_{k=0}^{K-1} V_k g(x(i+k); a)^p\right]^r \quad \text{Equation (4)}$$

Where $V_k$ is a window (e.g. rectangular, hamming, etc.) and g(x) is can be chosen as a convex or non-convex function, and p and r are real numbers. As an example, g(x;a) can be chosen as although not limited too:

$$g(x; a) = \frac{1}{|x|(1 + a|x| + a^2|x|^2)} \quad \text{Equation (5)}$$

Selection of the regularization function ($\varphi(Dx; a, K)$ in Equation (1)) will affect performance because different regularization functions model different types of apriori knowledge about the pulse. For the example results described herein, we first define a mixed norm in Equation (6) for our penalty function.

$$\varphi_G(x) = \sum_{i=1}^{N} \left[\sum_{k=0}^{K-1} V_k |x(i+k)|^2\right]^{1/2} \quad \text{Equation (6)}$$

Rather than penalizing high values of $\varphi_G(x)$ in Equation (1), we may penalize $\varphi_G(D^m x)$ where $D^m$ is the mth order difference operator, which can be written as a difference matrix. For m=1, D is the (N−1)×N difference matrix where the first row is [−1 1 zeros(1,N−2)]. $D^2$ is similarly defined as a (N−2)×N matrix with the first row [−1 2−1 zeros(1,N−3)]. Each additional row is then shifted by one zero to the right, relative to the previous row. The rows of the difference matrix, D, can be written as any filter, including a notch filter.

This model takes into account that the derivative of the pulse has groups of coefficients that are clustered together and is designed to penalize large clusters of non-zero derivative coefficients. For the experimental results described herein, the first order difference penalty function $\varphi_G(Dx)$, which penalizes a cluster of derivative coefficients is used in Equation (1) is used.

Now regarding Joint Group-Sparse Denoising and Delay (JGSDD) techniques, an iterative solution of Equation (1) consists of fixing a, solving Equation (1) for multiple values of a, and choosing a vector, x, such that the cost function of Equation (1) is minimized. Such a solution is derived, in embodiments, by various methods including: Majorization Minimization, Proximal Methods, Forward-Backward Splitting, and other non-linear, convex optimization techniques. An algorithm using Majorization-Minimization (denoted by joint group-sparse denoising and delay (JGSDD) estimator representing an embodiment of the present invention is presented below to measure the rise-time from the output of multiple channels (Figueiredo, Mario AT, et al. "On total variation denoising: A new majorization-minimization algorithm and an experimental comparison with wavelet denoising." 2006 International Conference on Image Processing. IEEE, 2006.). Each estimate of x at each iteration L, is denoted by $x^{(L)}$. Here we assume that the SNR for both channels are similar; if they are estimated to be different, then the coefficient vectors of $w_1$ and $w_2$ can be set to a function of the SNR that is linear or quadratic or another arbitrary function designed to emphasize the higher SNR channel relative to the lower SNR channel.

Figure 1:
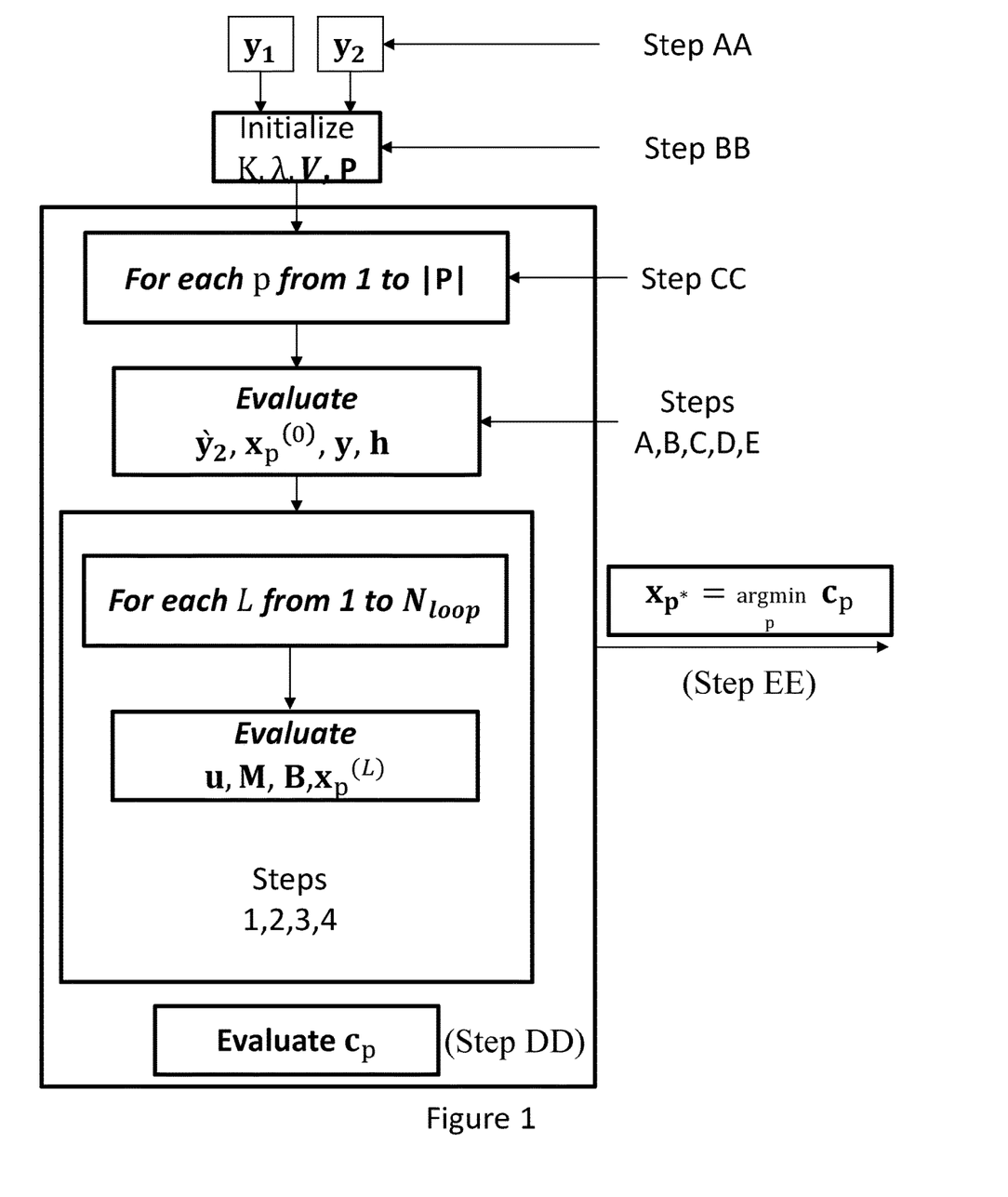
FIG. 1 is a flowchart describing a method of JGSDD in accordance with embodiments of the present disclosure.

Now referring to FIG. 1, a method of JGSDD is described. More specifically, the method comprises:

Step AA) Obtain: $y_1$, $y_2$, where $y_1$ and $y_2$ are noisy, base-band samples of a pulse;

Step BB) Initiliaze the values of K, λ, V, P, where K initializes a group over-lap parameter, Δ is a regularization parameter, V is a weighting vector that represents uniform, hamming, hanning, or other types of weighting parameter used in the regularization function of Equation (6), P represents a set of P delay values such that $T=\{\tau_1, \tau_2 \ldots \tau_p\}$ and to initialize the value of a variable means to set the vector or scalar to a specific value;

Step CC) Outer loop: For each feasible value of $\tau_p$ indexed by p from 1 to P (where p represents an index for the delay values);

Step A) Shift $y_2$ by $\tau_p$ sample delays, which, mathematically, can be expressed as $\acute{y}_2 = y_2(n-\tau_p)$ and where shifting a variable by another variable means to shift the samples of a signal by moving the signal to the left or right along a discrete time axis;

Step B) Initialize the value of L=0 (where 1 represents the current iteration of the loop);

Step C) Set $x_p^{(0)} = 0.5*(y_1 + \acute{y}_2)$, where $x_p^{(L)}$ represents the estimate of x at the Lth iteration); Here we have averaged the shifted value $y_2$ derived from step A with that of $y_1$. This is done so that the best candidate estimate of x can be estimated from the two independent measurements.

Step D) Set $y = x_p^{(0)}$ (Initialization Parameter);

Step E) Set $h = D^T y$ (Initialization Parameter)

Step F) Inner Loop: Repeat until convergence for L=1: $N_{loop}$

Step 1) Set $u = D x_p^{(L-1)}$, where D is the first order difference operation and u is a temporary variable used in the optimization);

Step 2)

$$[M]_{n,n} = \sum_{j=0}^{K-1} \left[ \sum_{k=0}^{K-1} |V_k u(n-j+k)|^2 \right]^{-.5},$$

where u is weighted by a window $V_k$, in embodiments rectangular, hamming, hanning, etc.;

Step 3)

$$B = \frac{1}{\lambda} M^{-1} + DD^T,$$

where B is a constant Matrix;

Step 4) $x_p^{(1)} = y - D^T(B^{-1} h)$;

Finish Inner Loop Step F:

Step DD) Evaluate $$c_p = \left\{ \frac{1}{2} \|y_1 - x\|_2^2 + \frac{1}{2} \|\acute{y}_2 - x\|_2^2 + \lambda(\varphi_G(Dx_p)) \right\}$$

Finish Outerloop from step CC:

Final Output is then provided in Step EE, below:

Step EE)

$$x_{p*} = \underset{p}{\mathrm{argmin}}\, c_p,$$

from the set of $c_p$ where p represents different delay values $\tau_p$, choose the index p* that corresponds to the minimum value of $c_p$. Then $x_{p*}$ is the optimum solution obtained from the algorithm to estimate x which is the original pulse.

It should be noted that, for the integer value $N_{loop}$, one can choose a tolerance value that evaluates the successive difference of the solution obtained in the current inner loop $x_p^{(L)}$ relative to the previous inner loop $x_p^{(L-1)}$ for a norm such as the L2 norm. Alternatively, one can choose a number of iterations $N_{loop}$ based to run the iterative optimization solution a priori. Yet another method is to evaluate the difference of $c_p$ as function of successive values of p and p−1 for a norm, such as the L2 norm. Other methods to evaluate convergence to a unique solution would also be known to those knowledgeable of the arts.

Once $x_{p*}$ is estimated, then we may estimate the rise-time of $x_{p*}$ between two reference levels, such as the time from the pulses to rise from 0.1 to the 0.9 amplitude levels (i.e. the rise time of the pulse).

Now regarding the special case of single channel estimation and rise-time estimation, using Equation (1), by setting $w_2=0$, one can estimate $x_1$. Similarly, by setting $w_1=0$, one can get an estimate of $x_2$ and then use this estimate to estimate rise-time. Although various methods and definitions exist for rise-time and its measurement, to estimate the rise-time, here we provide a simple definition of measuring the rise-time between the 0.1 and 0.9 amplitude levels of the peak. Other common reference levels such as 0.2 to 0.8 or 0.3 to 0.07 amplitude levels can also be chosen in parallel for better estimation and feature classification of pulses, as needed.

In general, this method utilizes both data-sets independently and, theoretically, should not perform as well as joint-decoding. This method, however, has the advantage of not requiring an optimization to be solved for each a and provides results that are still significantly better than traditional cross-correlation techniques. The computational cost is also reduced significantly by the number of candidate delays that are used to solve Equation (1).

One method to speed up the joint estimation process of embodiments is to solve the single channel to obtain a narrower range of candidate delay values. Another method is to use parallelization, since each candidate delay lends itself to a different optimization program.

Now regarding obtaining the solution of the optimization, a variety of approaches including ADMM, Proximal Splitting Methods, Majorization Minimization, brute-force search, and others, as would be known to one of ordinary skill in the art, can be used to solve Equation (1). These and other approaches can be found described in the following texts, which are herein incorporated by reference, in their entirety: Afonso, Manya V., Jośe M. Bioucas-Dias, and Mario AT Figueiredo. "An augmented Lagrangian approach to the constrained optimization formulation of imaging inverse problems." IEEE Transactions on Image Processing 20.3 (2011): 681-695; Combettes, Patrick L., and Jean-Christophe Pesquet. "Proximal splitting methods in signal processing." Fixed-point algorithms for inverse problems in science and engineering. Springer, New York, N.Y., 2011. 185-212; and Figueiredo, Mario AT, Jose M. Bioucas-Dias, and Robert D. Nowak. "Majorization—minimization algorithms for wavelet-based image restoration." IEEE Transactions on Image processing 16.12 (2007): 2980-2991.

It should be noted that, given the filter operations are banded matrices, the solution of Equation (1) can, in general, involve banded matrixes, which are efficient from a numerical computational implementation.

Now regarding our sample experimental result, we illustrate the aforementioned methods and systems that make use of them by the following rise-time experiment, which is tabulated in Table 1, below.

TABLE 1

Parameters of the rise-time experiment

| Rise-time | Delay | Pulse-Width | Sampling Rate | Signal-to-Noise Ratio (dB) |
|---|---|---|---|---|
| 50 nanoseconds | 0.02 microseconds | 0.5994 microseconds | 1600 MHz | [−6:20] dB |

Figure 4:
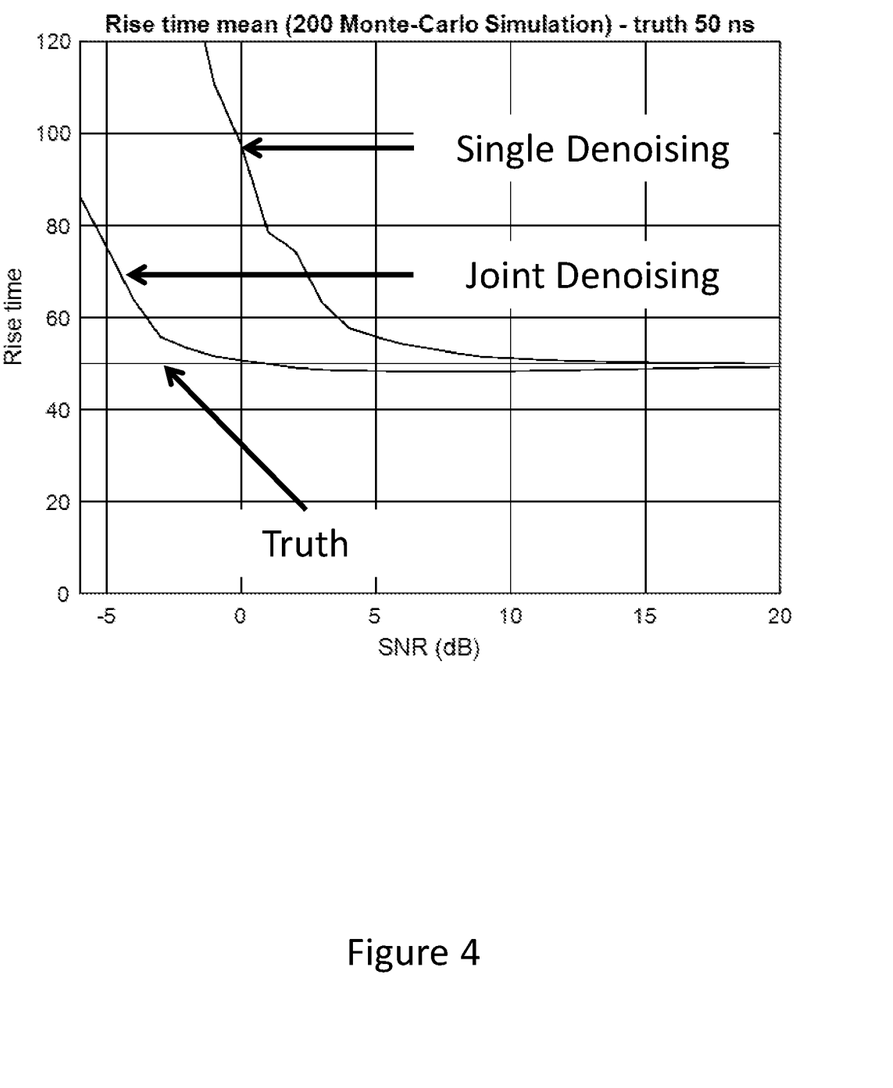
FIG. 4 is a plot showing the root-mean square (RMS) error of the rise-time estimator of FIG. 3 from the truth over 200 simulation points as a function of SNR.
Figure 5:
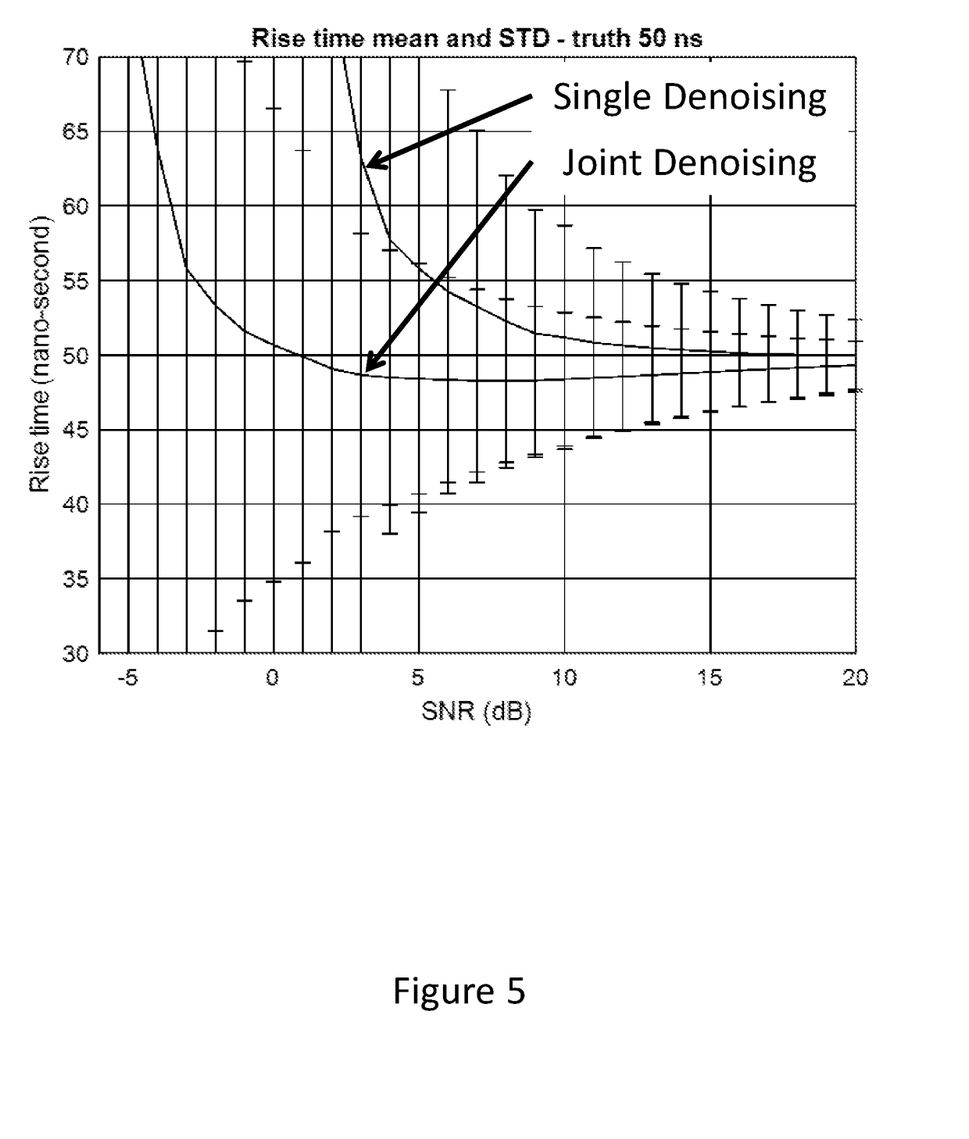
FIG. 5 is a plot illustrating the root-mean-square error of both single and dual channel rise-time estimators.

Now specifically referring to FIG. 2, FIG. 2 illustrates the pulse on both channels with a relative delay based on the parameters tabulated in Table 1. FIG. 3 shows a noisy pulse, an estimated pulse, and an ideal pulse using the single channel algorithm. FIG. 4 shows the estimated mean rise-time using both the single channel and multi-channel (in this case two) estimator over 200 simulation points for each SNR. We note that the mean rise time is correctly estimated for the dual channel case at SNR of 0 dB. Consequently, we may use the algorithm over multiple pulses and take a mean of the individual rise-times to obtain better accuracy Finally, FIG. 5 illustrates the root-mean-square error of both the single and dual channel rise-time estimators.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

What is claimed is:

1. A method of estimating a rise-time of a pulse for single and multi-channel data, the method comprising:
receiving a first signal, $y_1$, and a second signal, $y_2$, wherein the first and second signal are signals received on an antenna of a radar system;
using the following equation:

$$F_\lambda\{y_1, y_2\} = \operatorname*{argmin}_{x,a,K,C}\left\{\frac{1}{2}w_1 \cdot \|y_1 - x\|_2^2 + \frac{1}{2}w_2 \cdot \|y_2 - x\|_2^2 + \lambda \cdot (\varphi(Dx; a, K))\right\}$$

where $w_1$ and $w_2$ are weights for the data-fidelity terms,
where $\lambda$ is a weight for the regularization function,
where C is an amplitude scaling factor,
where $\varphi$ (x; a) represents a regularization function,
where D is a difference matrix,
where K initializes a group over-lap parameter, and
where $\alpha$ is a real value;
fixing $\alpha$;
solving for multiple values of $\alpha$;
choosing a vector, x, such that a cost function is minimized; and
estimating the rise time of the pulse;
discriminating, by the radar system, between a plurality of radar types based on the estimated rise time of the pulse;
wherein the first signal and the second signal are measured across different antenna elements of the radar system; and
wherein one of the first signal or second signal is a delayed amplitude, scaled version of the other signal.

2. The method of claim 1, wherein $y_1(n)=x(n)+v_1(n)$ and $y_2(n)=\zeta(S^{-\alpha}x(n))+v_2(n)$, where $S^{-\alpha}$ denotes a delay operator, v represents noise and interference, and x represents an original version of the first signal and the second signal.

3. The method of claim 1 wherein the regularization function is convex or non-convex.

4. The method of claim 1 wherein the regularization function is chosen such that it is assumed x is a data whose first order difference is sparse relative to its length, and its non-zero coefficients are clustered together.

5. The method of claim 1 wherein solving the equation comprises the use of a method chosen from the group consisting of Majorization, ADMM, Proximal Methods, and non-linear, iterative convex optimization techniques.

6. The method of claim 1 wherein the regularization function comprises:

$$\varphi(x; a) = \sum_{i=1}^{N} \frac{2}{a\sqrt{3}} \left( \left( \arctan \frac{1 + 2af(x_i; K)}{\sqrt{3}} \right) - \frac{\pi}{6} \right)$$

and wherein $f(x_i;K)$ is chosen to promote over-lapping structure sparsity and is defined as:

$$f(x_i; K) = \left[ \sum_{k=0}^{K-1} |x(i+k)|^2 \right]^{\frac{1}{2}}.$$

7. The method of claim 6 wherein solving for $f(x_i;K)$ comprises the use of an approach selected from the group consisting of Alternating Direction Method of Multipliers, Proximal Splitting, Majorization, Minimization, and Brute-Force.

8. The method of claim 7 wherein $f(x_i;K)$ is generalized through the use of a weighting function to weight the sum.

9. The method of claim 8 wherein the weighting function is a hamming-type function.

10. The method of claim 1 wherein the regularization function comprises:

$$\varphi(x; a) = \sum_{i=1}^{N} \left[ \sum_{k=0}^{K-1} V_k g(x(i+k); a)^p \right]^r,$$

where:
- $V_i$ is a window,
- p and r are real numbers, and
- g (x) is a convex or non-convex function.

11. The method of claim 10 wherein $$g(x; a) = \frac{1}{|x|(1 + a|x| + a^2|x|^2)}.$$

12. A method of estimating the rise-time of a pulse for single and multi-channel data, the method comprising:
receiving a first signal, $y_1$, and a second signal, $y_2$, wherein the first and second signal are received on an antenna coupled to a radar system;
using the following equation:

$$F_\lambda\{y_1, y_2\} = \underset{x,a,K,C}{\operatorname{argmin}} \left\{ \frac{1}{2} w_1 \cdot \|y_1 - x\|_2^2 + \frac{1}{2} w_2 \cdot \|y_2 - x\|_2^2 + \lambda \cdot (\varphi(Dx; a, K)) \right\}$$

where $w_1$ and $w_2$ are weights for the data-fidelity terms,
where $\lambda$ is a weight for the regularization function,
where C is an amplitude scaling factor,
where $\varphi(x; a)$ represents a regularization function,
where D is a difference matrix,
where K initializes a group over-lap parameter, and
where $\alpha$ is a real value;
fixing $\alpha$;
solving for multiple values of $\alpha$;
choosing a vector, x, such that a cost function of is minimized; and
estimating the rise time of the pulse;
discriminating, by the radar system, between a plurality of radar types based on the estimated rise time of the pulse;
wherein the first signal and the second signal are measured across different antenna elements of the radar system;
wherein one of the first signal or second signal is a delayed amplitude, scaled version of the other signal;
wherein $y_1(n)=x(n)+v_1(n)$ and $y_2(n)=\zeta(S^{-\alpha}x(n))+v_2(n)$, where $S^{-\alpha}$ denotes a delay operator, v represents noise and interference, and x represents an original version of the first signal and the second signal;
wherein the regularization function is chosen such that it is assumed x is a data whose first order difference is sparse relative to its length, and its non-zero coefficients are clustered together;
wherein the regularization function comprises:

$$\varphi(x; a) = \sum_{i=1}^{N} \frac{2}{a\sqrt{3}} \left( \left( \arctan \frac{1 + 2af(x_i; K)}{\sqrt{3}} \right) - \frac{\pi}{6} \right);$$

and
wherein $f(x_i;K)$ is chosen to promote over-lapping structure sparsity and is defined as:

$$f(x_i; K) = \left[ \sum_{k=0}^{K-1} |x(i+k)|^2 \right]^{\frac{1}{2}}.$$

13. A method of estimating the rise-time of a pulse for single and multi-channel data, the method comprising:
receiving a first signal, $y_1$, and a second signal, $y_2$, on an antenna of a radar system;
using the following equation:

$$F_\lambda\{y_1, y_2\} = \underset{x,a,K,C}{\operatorname{argmin}} \left\{ \frac{1}{2} w_1 \cdot \|y_1 - x\|_2^2 + \frac{1}{2} w_2 \cdot \|y_2 - x\|_2^2 + \lambda \cdot (\varphi(Dx; a, K)) \right\}$$

where $w_1$ and $w_2$ are weights for the data-fidelity terms,
where $\lambda$ is a weight for the regularization function,
where C is an amplitude scaling factor,
where $\varphi(x; a)$ represents a regularization function,
where D is a difference matrix,
where K initializes a group over-lap parameter, and
where $\alpha$ is a real value;
fixing $\alpha$;
solving for multiple values of $\alpha$;
choosing a vector, x, such that a cost function of is minimized; and
estimating the rise time of the pulse;
wherein the first signal and the second signal are measured across different antenna elements of the radar system;
wherein one of the first signal or second signal is a delayed amplitude, scaled version of the other signal;
wherein $y_1(n)=x(n)+v_1(n)$ and $y_2(n)=\zeta(S^{-\alpha}x(n))+v_2(n)$, where $S^{-\alpha}$ denotes a delay operator, v represents noise and interference, and x represents an original version of the first signal and the second signal;
wherein the regularization function is chosen such that it is assumed x is a data whose first order difference is sparse relative to its length, and its non-zero coefficients are clustered together;
wherein the regularization function comprises:

$$\varphi(x; a) = \sum_{i=1}^{N} \left[ \sum_{k=0}^{K-1} V_k g(x(i+k); a)^p \right]^r,$$

where:
$V_i$ is a window,
p and r are real numbers, and
g (x) is a convex or non-convex function, and wherein $$g(x; a) = \frac{1}{|x|(1 + a|x| + a^2|x|^2)}.$$

14. The method of claim 1, performing a single channel estimation by setting $w_1$ equal to zero and estimating a vector $x_1$, setting $w_2$ is set to equal zero, and estimating a vector $x_2$, and then estimating the rise time.

15. The method of claim 1, wherein the estimated rise time of the pulse is used for geolocation of a source of the first signal and the second signal.

16. The method of claim 1, wherein the estimated rise time of the pulse is used for identification of a source of the first signal and the second signal.

17. The method of claim 1, wherein the estimating of the rise time of the pulse is calculated between 0.1 and 0.9 amplitude levels of the peak.

18. The method of claim 1, wherein the estimating of the rise time of the pulse is calculated between 0.2 and 0.8 amplitude levels of the peak.

19. The method of claim 1, wherein the estimating of the rise time of the pulse is calculated between 0.3 and 0.7 amplitude levels of the peak.

* * * * *